US010332722B2

(12) United States Patent
Asai et al.

(10) Patent No.: US 10,332,722 B2
(45) Date of Patent: Jun. 25, 2019

(54) ION MILLING DEVICE AND ION MILLING METHOD (71) Applicant: Hitachi High-Technologies Corporation, Minato-ku, Tokyo (JP)

(72) Inventors: Kengo Asai, Tokyo (JP); Hiroyasu Shichi, Tokyo (JP); Hisayuki Takasu, Tokyo (JP); Toru Iwaya, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 15/500,392

(22) PCT Filed: Jul. 29, 2015

(86) PCT No.: PCT/JP2015/071432
§ 371 (c)(1),
(2) Date: Jan. 30, 2017

(87) PCT Pub. No.: WO2016/017660
PCT Pub. Date: Feb. 4, 2016

(65) Prior Publication Data
US 2017/0221677 A1    Aug. 3, 2017

(30) Foreign Application Priority Data

Jul. 30, 2014   (JP) ................................ 2014-154423

(51) Int. Cl.
*H01J 37/302*      (2006.01)
*H01J 37/24*       (2006.01)
(Continued)

(52) U.S. Cl.
CPC ............ *H01J 37/302* (2013.01); *H01J 27/04* (2013.01); *H01J 37/08* (2013.01); *H01J 37/243* (2013.01);
(Continued)

(58) Field of Classification Search
CPC ........ H01J 37/08; H01J 37/302; H01J 37/305; H01J 37/243; H01J 37/304; H01J 37/3053;
(Continued)

(56) References Cited

U.S. PATENT DOCUMENTS

| 4,423,355 A | 12/1983 | Kageyama |
| 7,619,224 B2 | 11/2009 | Chen et al. |

(Continued)

FOREIGN PATENT DOCUMENTS

| JP | 2000-355764 A | 12/2000 |
| JP | 2006-351374 A | 12/2006 |

(Continued)

OTHER PUBLICATIONS

International Search Report, PCT/JP2015/071433, dated Oct. 20, 2015.
(Continued)

*Primary Examiner* — Nicole M Ippolito
*Assistant Examiner* — Sean M Luck
(74) *Attorney, Agent, or Firm* — Miles & Stockbridge P.C.

(57) ABSTRACT

To provide an ion gun of a penning discharge type capable of narrowing a beam with a low ion beam current at a low acceleration voltage, an ion milling device including the same, and an ion milling method.
An ion milling device that controls half width of a beam profile of an ion beam with which a sample is irradiated from an ion gun to be in a range of 200 μm to 350 μm. The device includes: the ion gun that ionizes a gas supplied from the outside, and emits an ion beam; a gas-flow-rate varying unit that varies a flow rate of the gas supplied to the ion gun; and a current measurement unit that measures a current value of the ion beam emitted from the ion gun. The gas-flow-rate
(Continued)

varying unit sets a gas flow rate to be higher than a gas flow rate at which the ion beam current has a maximum value based on the current value measured by the current measurement unit and the flow rate of the gas determined by the gas-flow-rate varying unit.

10 Claims, 6 Drawing Sheets (51) Int. Cl.
    *H01J 37/08*     (2006.01)
    *H01J 37/305*     (2006.01)
    *H01J 37/304*     (2006.01)
    *H01J 27/04*     (2006.01)

(52) U.S. Cl.
    CPC .......... *H01J 37/304* (2013.01); *H01J 37/305* (2013.01); *H01J 37/3053* (2013.01); *H01J 2237/08* (2013.01); *H01J 2237/30461* (2013.01); *H01J 2237/3151* (2013.01)

(58) Field of Classification Search
    CPC ......... H01J 2237/08; H01J 2237/30461; H01J 2237/3151
    See application file for complete search history.

(56) References Cited

U.S. PATENT DOCUMENTS

| | | |
|---|---|---|
| 2005/0232320 A1 | 10/2005 | Tateno |
| 2006/0076510 A1* | 4/2006 | Chang ................ H01J 37/3171 250/492.21 |
| 2006/0284105 A1 | 12/2006 | Yamashita et al. |
| 2007/0221871 A1* | 9/2007 | Callahan ............ H01J 37/3171 250/492.21 |
| 2009/0321657 A1* | 12/2009 | Satoh ...................... H01J 37/05 250/423 R |
| 2010/0055345 A1* | 3/2010 | Biloiu ..................... H01J 27/18 427/569 |
| 2010/0143198 A1* | 6/2010 | Damiano, Jr. ....... G01N 23/046 422/400 |
| 2011/0248179 A1 | 10/2011 | Matesa, Jr. et al. |
| 2011/0259269 A1* | 10/2011 | Biloiu ..................... H01J 27/16 118/723 I |
| 2012/0025072 A1* | 2/2012 | Toyoda ................. H01J 27/024 250/287 |
| 2012/0286175 A1* | 11/2012 | Searle ..................... G01N 1/42 250/492.3 |
| 2013/0094991 A1* | 4/2013 | Nagata ................. B23K 35/264 420/577 |
| 2017/0221671 A1 | 8/2017 | Asai et al. |

FOREIGN PATENT DOCUMENTS

| | | |
|---|---|---|
| JP | 2007-048588 A | 2/2007 |
| JP | 2012-033335 A | 2/2012 |
| JP | 2012-156077 A | 8/2012 |
| JP | 2013-524467 A | 6/2013 |

OTHER PUBLICATIONS

International Search Report, PCT/JP2015/071432, dated Oct. 13, 2015.
Office Action dated Jun. 19, 2018 for Japanese Application No. 2017-189451 and English language machine translation.
Office Action dated Mar. 30, 2018 for U.S. Appl. No. 15/500,449.
Translation to Shidouji (JP 2000-355764 as cited on IDS) published Dec. 2000.
Final Office Action dated Oct. 18, 2018 for U.S. Appl. No. 15/500,449.

* cited by examiner

ION MILLING DEVICE AND ION MILLING METHOD

TECHNICAL FIELD

The present invention relates to an ion milling device and an ion milling method for manufacturing a sample.

BACKGROUND ART

An ion milling method is a processing method of milling a sample by using a sputtering phenomenon in which accelerated ions collide with the sample and the ions repel atoms or molecules. A mask as a shielding plate of an ion beam is mounted on a top surface of the sample to be processed, and a smooth sectional surface can be processed by sputtering a protruding portion from a mask end surface. This method is used for targets such as metal, glass, ceramic, electronic components, and composite materials. For example, this method is used for analyzing an internal structure, a sectional shape, film thickness evaluation, crystalline state, failure, or foreign-substance sectional surface of the electronic component. This method is used as a section sample creating method for performing acquisition of a morphological image, a sample compositional image, or a channeling image using various measurement devices including a scanning electron microscope, X-ray analysis, or crystallographic orientation analysis.

In the above-described ion milling device, an ion gun of a simple and small penning discharge type may be used as an ion gun. The ion gun of the penning discharge type has an advantage of achieving a high milling rate since energy of the ion beam is high. PTL 1 describes a method of constantly maintaining a current value of the ion beam emitted from the ion gun at a maximum value in order to maintain a high milling rate.

CITATION LIST

Patent Literature

PTL 1: JP-A-2007-48588
PTL 2: JP-T-2013-524467
PTL 3: JP-A-2012-156077

SUMMARY OF INVENTION

Technical Problem

An ion milling device on which an ion gun of a penning discharge type is mounted has a relatively high energy of an ion beam. Thus, the present invention is greatly useful in order to realize a high milling rate under a condition of a high acceleration voltage. Thus, as in PTL 1, there is described that it is preferable that a current value of the ion beam emitted from the ion gun is constantly maintained at the maximum value and the reason why the ion beam current value is decreased during the processing is that a vacuum level is changed during the processing, and there is described a processing method of previously setting a gas flow rate on the assumption that the vacuum level is changed such that a gas pressure at which the current value becomes a maximum value during the processing is acquired. In such an ion gun of the ion penning discharge type, a high ion beam current is required in the past.

FIG. 3 of PTL 2 describes the relationship between the gas flow rate and the ion beam current value, and descries that as the gas flow rate is increased from an assumption value, the ion beam current value is gradually decreased. However, since an object of PTL 2 is to ensure the large ion beam current value, PTL 2 does not completely describe a technology of using an area of a small ion beam current value.

Meanwhile, in a case where a material having a low melting point is processed, there is a concern that a sample section is damaged by accumulation of heat due to the energy of the ion beam. In recent years, the organic polymeric material has been also widely utilized in the field of electronic devices such as organic EL, and there has been an increasing need for processing at a low acceleration voltage effective in suppressing thermal damage of the sample. There is a problem of the sample damage by thermal damage in the processing of a Cu—Zn based alloy or lead-free solder used for terminal connectors of electronic and electric devices or a material having a melting point lower than that of the Cu—Zn based alloy or the lead-free solder.

PTL 2 describes that the sample damage can be suppressed to the minimum by using the low acceleration voltage, and also describes that a spot size on the sample is increased due to the use of the low acceleration voltage in the ion gun of the penning discharge type.

As a result of the examination of the present inventors, since a potential difference is generated between a cathode and an acceleration-electrode outlet hole in the ion gun of the penning discharge type, a lens is provided in this space. Since strength of the lens is proportional to the potential difference between the cathode and the acceleration-electrode outlet hole, as the acceleration voltage becomes higher, the strength of the lens becomes higher. Thus, the beam is narrowed. However, it is found that since a lens effect is decreased at the low acceleration voltage, the ion beam spreads, and thus, there is a problem that a spot diameter on the sample becomes larger.

PTL 3 describes an ion gun of a hollow-anode discharge type as an ion gun capable of easily controlling the ion beam current at the low acceleration voltage. However, PTL 3 also describes that a processing speed in the ion gun of the hollow-anode discharge type is remarkably lower than that in the ion gun of the penning discharge type at the high acceleration voltage. In a case where the ion gun of the hollow-anode discharge type is applied at the low acceleration voltage, there is a problem that both the low acceleration voltage and the high milling rate are not able to be achieved.

The present inventors have recognized such a problem, and have repeatedly conducted the experiment. The present invention has been made from knowledge acquired through the experiment, and it is an object of the present invention to particularly provide an ion gun of a penning discharge type capable of reducing a spot diameter of a beam at a low acceleration voltage by a simple method or an ion gun having a shape conformable to the penning discharge type, and an ion milling device including the same.

Solution to Problem

In order to achieve the above-described object, there are provided an ion gun, an ion milling device including the same, and an ion milling method according to the present invention. As a specific aspect, there is provided an ion milling device that controls half width of a beam profile of an ion beam with which a sample is irradiated from an ion gun to be in a range of 200 μm to 350 μm. The device includes: the ion gun that ionizes a gas supplied from the outside, and emits an ion beam; a gas-flow-rate varying unit that varies a flow rate of the gas supplied to the ion gun; and a current measurement unit that measures a current value of the ion beam emitted from the ion gun. The gas-flow-rate varying unit sets a gas flow rate to be higher than a gas flow rate at which the ion beam current has a maximum value based on the current value measured by the current measurement unit and the flow rate of the gas determined by the gas-flow-rate varying unit.

There are provided an ion gun, an ion milling device including the same, and an ion milling method according to the present invention. As another specific aspect, there is provided an ion milling method of controlling half width of a beam profile of an ion beam to be in a range of 200 μm to 350 μm, and processing a sample. The method includes: an emission step of ionizing a gas supplied from the outside, and emitting an ion beam; an application step of applying a voltage ranging from 2 kV to 4 kV to an acceleration electrode of an ion gun; a flow-rate varying step of varying a flow rate of the gas supplied to the ion gun; a measurement step of measuring a current value of the ion beam emitted from the ion gun; a setting step of setting a gas flow rate to be higher than a gas flow rate at which the ion beam current has a maximum value based on the current value measured in the measurement step and the flow rate of the gas determined in the flow-rate varying step; and an irradiation step of irradiating the sample with the ion beam set in the setting step.

There are provided an ion gun, an ion milling device including the same, and an ion milling method according to the present invention. As still another aspect, there is provided an ion milling device that includes an ion gun that ionizes a gas supplied from the outside, and emits an ion beam, a gas-flow-rate varying unit that varies a flow rate of the gas which is supplied from the outside and is supplied to the ion gun, a current measurement unit that measures a current value of the ion beam emitted from the ion gun, an ion-beam-current control unit that is electrically connected to the current measurement unit, and a gas-flow-rate control unit that is electrically connected to the gas-flow-rate varying unit. The ion milling device is configured to: cause the gas-flow-rate control unit to set a gas flow rate to be higher than a gas flow rate at which the ion beam current has a maximum value based on measurement data of the current value of the ion beam measured by the current measurement unit; and control half width of a beam profile of an ion beam with which a sample is irradiated from the ion gun to be in a range of 200 μm to 350 μm.

Advantageous Effects of Invention

According to the present invention, it is possible to narrow an ion beam at a low acceleration voltage by a simple method. Therefore, it is possible to reduce thermal damage to a sample.

DESCRIPTION OF EMBODIMENTS

The present inventors have repeatedly conducted the experiment and have found that a beam profile of an ion beam can be controlled by controlling a gas flow rate supplied into an ionization chamber of an ion gun. Particularly, the present inventors have found that the ion beam profile of the ion beam can be controlled by measuring a gas flow rate at which an ion beam current has a maximum value and setting the gas flow rate to be higher than a flow rate value at which the ion beam current has the maximum value and the half width of the beam profile can be reduced to be in a range of 200 μm to 350 μm. According to the present invention, it has been checked that since an ion beam current value is also decreased as the diameter of the profile of the ion beam is reduced, thermal damage is greatly decreased.

Accordingly, it is possible to provide an ion gun of a penning discharge type capable of narrowing an ion beam at a low acceleration voltage by a simple method, an ion milling device including the same, and an ion milling method. Particularly, according to the present invention, since it is possible to arbitrarily select a desired ion beam current, a desired ion beam shape, and a desired milling rate by setting an acceleration voltage and an argon gas flow rate, cooling performance of a cooling source can be effectively utilized in a milling device combined with a cooling mechanism. Therefore, an advantage of milling with small thermal damage is exhibited. Particularly, the present invention is greatly useful to performing ion milling on a Cu—Zn alloy, lead-free solder, or an organic polymeric material.

Hereinafter, a preferred embodiment of the present invention will be described with reference to the drawings.

Figure 1:
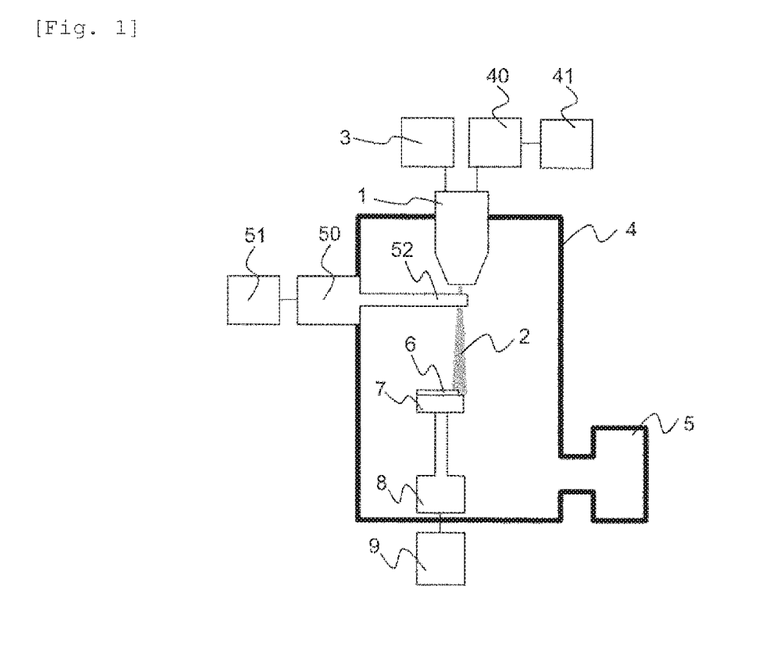
FIG. 1 is an explanatory diagram showing a configuration of an ion milling device of the present invention.

FIG. 1 is an explanatory diagram showing a configuration of an ion milling device of the present invention. In an ion gun 1 of a penning discharge type or having a form conformable to this type, constituent elements required to generate ions are provided therein, and an irradiation system for irradiating a sample 6 with an ion beam 2 is constituted. Next, a gas source 41 is connected to the ion gun 1 through a gas-flow-rate varying unit 40, and a gas of which a gas flow rate is controlled by the gas-flow-rate varying unit 40 is supplied into an ionization chamber of the ion gun 1. The irradiation using the ion beam 2 and an ion beam current thereof are controlled by an ion-gun control unit 3. The ion beam current of the ion beam 2 is measured by a current measurement unit 50.

A current probe 52 serves as a shutter of the ion beam, and includes a mechanism operated by a current-probe driving unit 51. A vacuum chamber 4 is controlled to be in an atmospheric state or a vacuum state by a vacuum pumping system 5. The sample 6 is held on a sample support 7, and the sample support 7 is held by a sample stage 8. The sample stage 8 includes all mechanism elements which are capable of taking the sample stage out of the vacuum chamber 4 when the vacuum chamber 4 is open to atmosphere and are capable of tilting the sample 6 with respect to an optical axis of the ion beam 2 at an arbitrary angle. A sample-stage driving unit 9 may swing the sample stage 8 from side to side, and may control a rate thereof.

Figure 2:
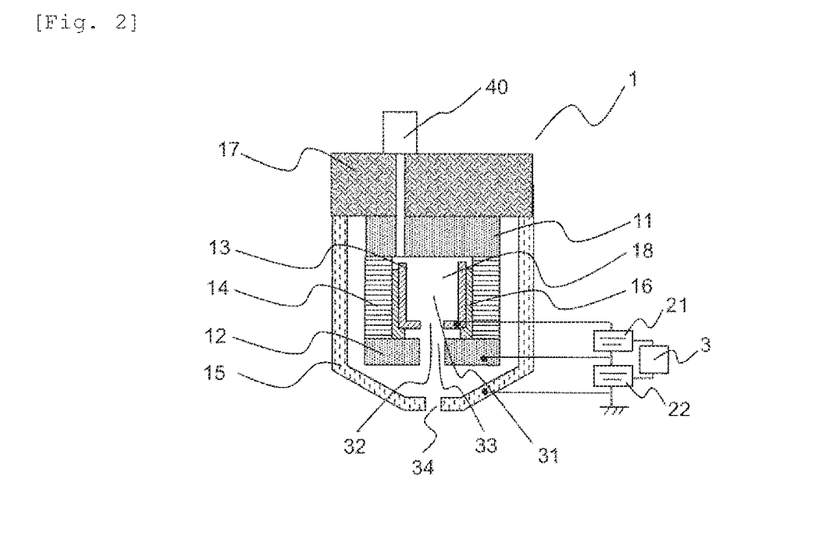
FIG. 2 is an example of a sectional view showing a configuration of a peripheral portion associated with an ion gun of the present invention.

FIG. 2 is an example of a sectional view showing a configuration of a peripheral portion associated with the ion gun of the present invention. The ion gun 1 includes the gas-flow-rate varying unit 40 that supplies a gas into the ion gun, an anode 13, a cathode 11, a cathode 12, a permanent magnet 14, an acceleration electrode 15, and an insulator 16, and is fixed to an ion gun base 17. The ion-gun control unit 3 is electrically connected to a discharge power source 21 and an acceleration power source 22, and controls a discharge voltage and an acceleration voltage.

In the ion gun of such a penning discharge type, since a potential difference is generated between the cathode 12 and an acceleration-electrode outlet hole 33, a lens is provided in this space. Since strength of the lens is proportional to the potential difference between the cathode 12 and the acceleration-electrode outlet hole 33, the higher the acceleration voltage, and the higher the lens strength. Thus, the beam is narrowed. However, since a lens effect is decreased at a low acceleration voltage, spreading of the beam becomes remarkable, and a spot diameter on the sample becomes larger.

Figure 3:
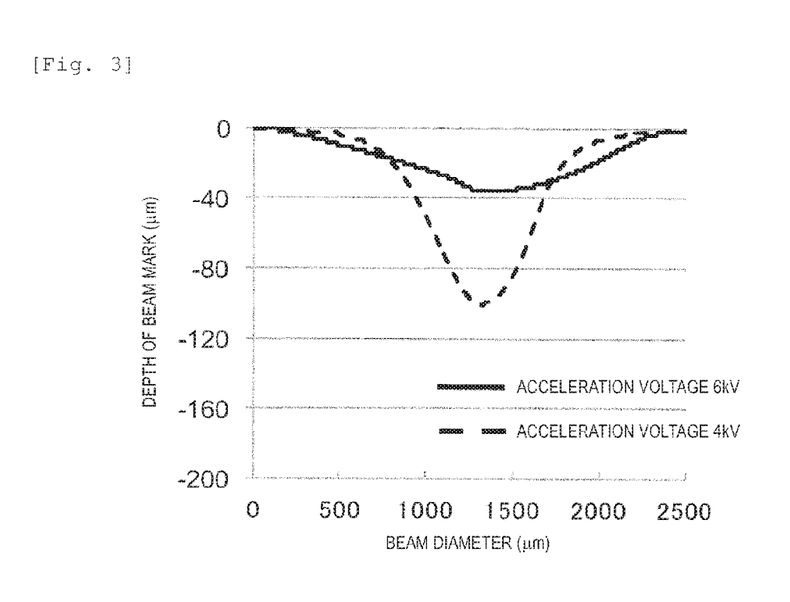
FIG. 3 is an example of an explanatory diagram showing the relationship between a spot depth and an acceleration voltage of an ion gun of a penning discharge type in a related art condition in which an ion beam current is set to be a maximum value.

FIG. 3 is an example of an explanatory diagram showing the relationship between a spot depth and an acceleration voltage of the ion gun of the penning discharge type in a related art condition in which an ion beam current is set to be a maximum value. As compared with a beam profile processed at an acceleration voltage of 6 kV, in a beam profile processed at an acceleration voltage of 4 kV, a depth of a beam mark is shallow, whereas a spot size of the ion beam is increased. Thus, it can be seen that influence of thermal diffusion on the sample is increased even though a low acceleration voltage is selected in order to perform low-damage processing.

The present inventors have repeatedly conducted the experiment in order to perform ion milling capable of achieving a small diameter of the beam spot without increasing a spot size of the ion beam even at a low acceleration voltage in the ion gun of the penning discharge type, and have found that the ion beam profile can be controlled by controlling the gas flow rate supplied into the ionization chamber 18 of the ion gun 1. Particularly, the present inventors have found that the small diameter of the ion beam can be achieved such that half width of the beam profile ranges from 200 μm to 350 μm by measuring the gas flow rate at which the ion beam current is acquired as the maximum value and setting the gas flow rate to be higher than a gas flow rate at which the ion beam current is the maximum value.

Figure 4:
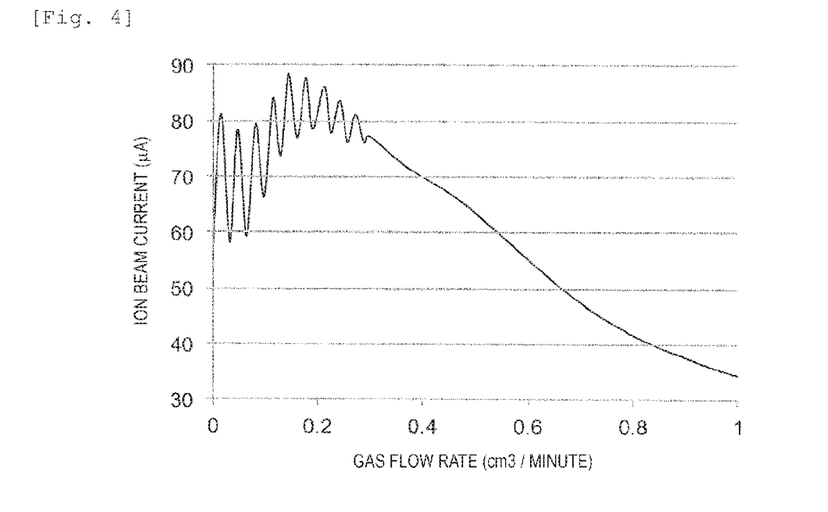
FIG. 4 is an example of an explanatory diagram showing the relationship between a gas flow rate and an ion beam current in order to describe an operation of the ion milling device of the present invention.

FIG. 4 is an example of an explanatory diagram showing the relationship between the gas flow rate and the ion beam current in order to describe an operation of the ion milling device of the present invention. Here, in a configuration of the ion gun 1 applied to the experiment, an anode inner diameter 31 is 8 mmϕ, an anode outlet hole 32 is 4 mmϕ, a cathode outlet hole 33 is 4 mmϕ, and the acceleration-electrode outlet hole 34 is 2 mmϕ. An application voltage of the discharge power source 21 is 1.5 kV, and an application voltage of the acceleration power source 22 is 4 kV, and the gas source 41 supplied into the ionization chamber 18 of the ion gun 1 is argon. The silicon is used as the processing target material, and a milling time is set to be one hour.

As seen from FIG. 4, the ion beam current is changed by increasing the gas flow rate introduced to the ion gun 1, and in the ion gun configuration which is applied to the experiment, the ion beam current tends to be increased in a range in which the argon gas flow rate is 0 to 0.2 cm$^3$/minute, and the ion beam current tends to be decreased in a range in which the argon gas flow rate is 0.2 to 1.0 cm$^3$/minute. In a range in which the argon gas flow rate is 0 to 0.3 cm$^3$/minute, the ion beam current value is greatly varied, and such a range is a an area where the ion beam current is extremely instable. In an area where the ion beam current is unstable, since a smaller potential difference is generated between the cathode outlet hole 33 and the acceleration-electrode outlet hole 34, the lens effect is decreased, and thus, the ion beam emitted at an acceleration voltage of 4 kV spreads. As a result, the ion beam is not able to pass through the acceleration-electrode outlet hole 34 of 2 mmϕ, and collides with the peripheral portion of the acceleration-electrode outlet hole 34.

This phenomenon causes bad influence such as the redeposition adhering to the acceleration electrode, the deformation of the acceleration-electrode outlet hole, or the contamination due to the redeposition in addition to the destabilization of the ion beam current. It can be seen from the result of FIG. 4 that the influence of the collision of the ion beam with the peripheral portion of the acceleration-electrode outlet hole 34 is excluded by increasing the argon gas flow rate and the stable ion beam current value is acquired.

Figure 5:
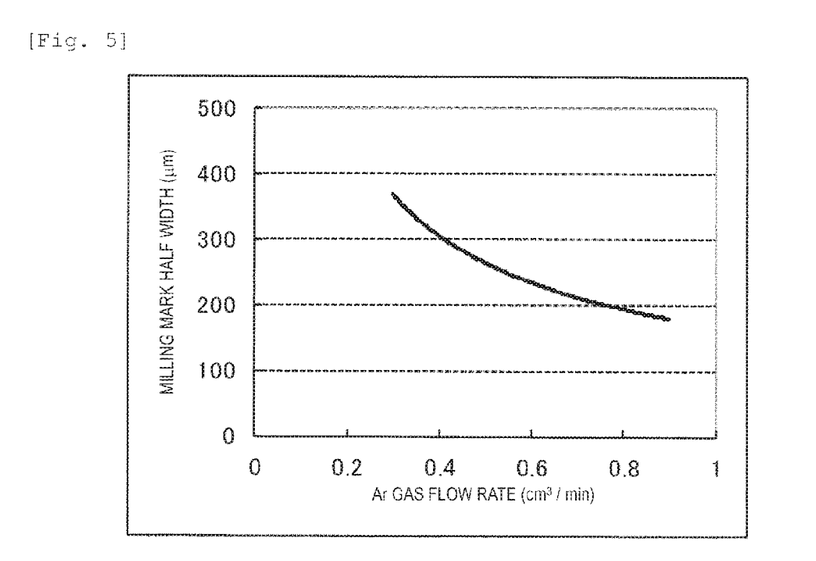
FIG. 5 shows an example of an explanatory diagram showing an advantage of the present invention.

FIG. 5 shows an example of the relationship between an argon gas flow rate and half width of an ion beam profile of the present invention. FIG. 5 shows that the diameter of the ion beam becomes smaller by increasing the argon gas flow rate in such a manner that the half width of the beam profile is 350 μm at an argon gas flow rate of 0.3 cm$^3$/minute, the half width of the beam profile is 250 μm at an argon gas flow rate of 0.5 cm$^3$/minute, and the half width of the beam profile is 200 μm or less at an argon gas flow rate of 0.65 cm$^3$/minute.

Figure 6:
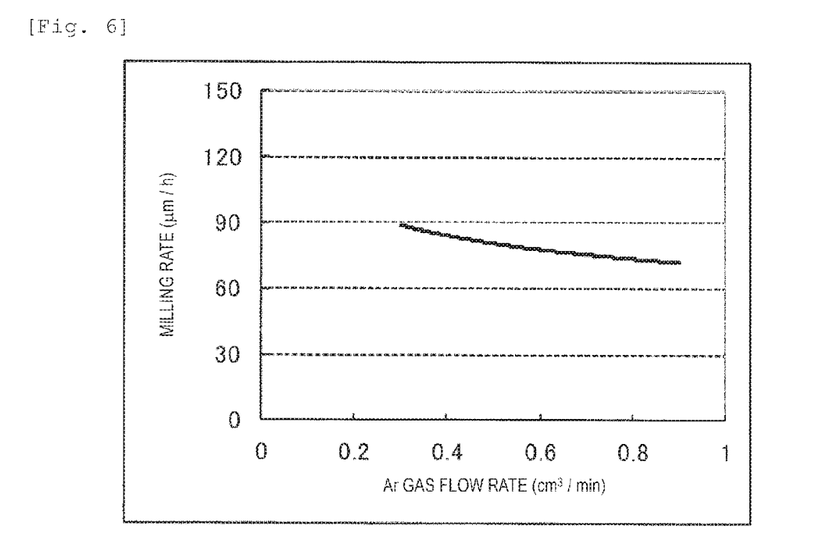
FIG. 6 shows an example of an explanatory diagram showing another advantage of the present invention.

FIG. 6 shows an example of the relationship between an argon gas flow rate and an ion milling rate of the present invention. FIG. 6 shows that the milling rate tends to be decreased in such a manner that the ion milling rate is 90 μm per hour at an argon gas flow rate of 0.3 cm$^3$/minute and the ion milling rate is 70 μm per hour at an argon gas flow rate of 0.9 cm$^3$/minute, but a decrease ratio thereof is not large so much to provide a practically sufficient milling rate for some milling targets.

Figure 7:
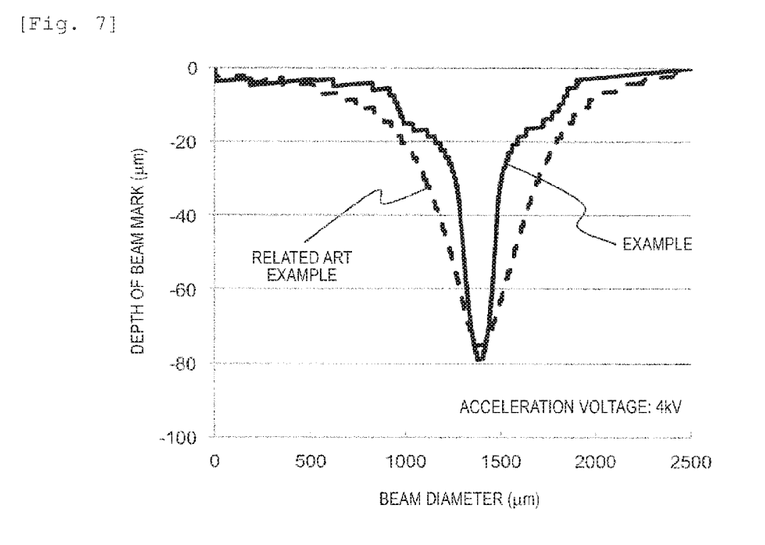
FIG. 7 is an example of an explanatory diagram showing a spot depth of the present invention.

FIG. 7 is an example of an explanatory diagram showing a spot depth of the present invention. Here, this diagram shows a beam profile in a case where the acceleration voltage condition is 4 kV, silicon is used as the processing target material, the milling time is set to be one hour. A related art example is a case where the argon gas flow rate is 0.07 cm$^3$/minute, and an example is a case where the argon gas flow rate is 0.9 cm$^3$/minute. According to the present invention, the half width of the ion beam profile is reduced to about 40% from that of the related art example. Depths of the ion beams, that is, milling rates are approximately equal to each other.

TABLE 1

Example of Preferable Range of Operation Parameter of Present Invention

|  | Preferable range | More preferable range | Setting example |
|---|---|---|---|
| Acceleration voltage (kV) | 4 | 4 | 4 |
| Gas flow rate (cm³/minute) | ≥0.3 | ≥0.6 | 0.9 |
| Gas pressure (Pa) | ≥6.0 × 10⁻² | ≥1.4 × 10⁻¹ | 2.0 × 10⁻¹ |
| Ion beam current (μA) | ≤85 | ≤55 | 45 |
| Beam spot half width (μm) | ≤370 | ≤230 | 190 |
| Beam spot depth (μm) | ≤90 | ≤75 | 75 |

Table 1 represents a list of a preferable parameter range, a more preferable parameter range, and a setting example in a case where milling is performed on silicon for one hour at an acceleration voltage of 4 kV. As the preferable range, the gas flow rate is 0.3 cm³/minute or more, an internal pressure of the vacuum chamber 4 in this case is 6.0×10 Pa or more, the acquired ion beam current value is 85 μA or less, the half width of the ion beam spot is 370 μm or less, and a beam spot depth is 90 μm or less.

As the more preferable range, the gas flow rate is 0.6 cm³/minute or more, the internal pressure of the vacuum chamber 4 in this case is 1.4×10⁻¹ Pa or more, the acquired ion beam current value is 55 μA or less, the half width of the ion beam spot is 230 μm or less, and the beam spot depth is 75 μm or less. As the setting example, the gas flow rate is 0.9 cm³/minute, the internal pressure of the vacuum chamber 4 in this case is 2.0×10⁻¹ Pa, the acquired ion beam current value is 45 μA, the half width of the ion beam spot is 190 μm, and the beam spot depth is 75 μm. It is possible to arbitrarily select the ion beam current value, the ion beam shape, and the milling rate by setting the acceleration voltage and the argon gas flow rate as represented in Table 1.

Figure 8:
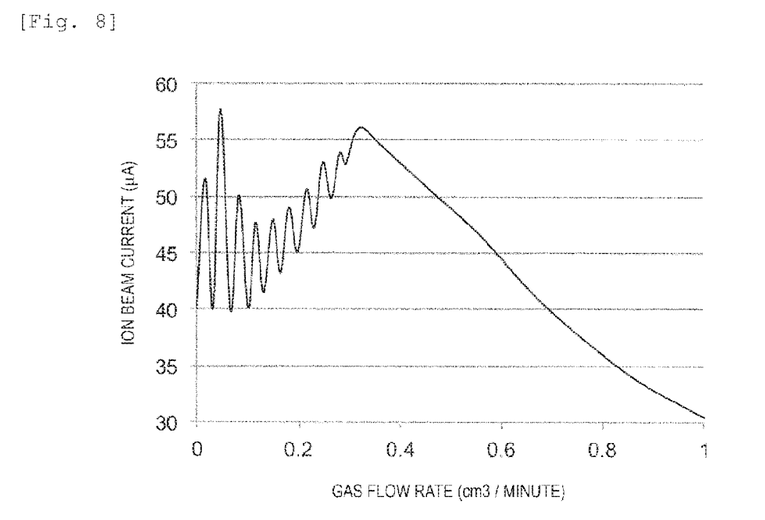
FIG. 8 is an example of an explanatory diagram showing the relationship between the gas flow rate and the ion beam current in order to describe another operation of the present invention.

FIG. 8 is an example of an explanatory diagram showing the relationship between the gas flow rate and the ion beam current in order to describe an operation of the present invention. Here, in a configuration of the ion gun 1 applied to the experiment, an anode inner diameter 31 is 8 mmφ, an anode outlet hole 32 is 4 mmφ, a cathode outlet hole 33 is 4 mmφ, and an acceleration-electrode outlet hole 34 is 2 mmφ. An application voltage of the discharge power source 21 is 1.5 kV, and an application voltage of the acceleration power source 22 is 3 kV, and the gas source 41 supplied into the ionization chamber 18 of the ion gun 1 is argon. The silicon is used as the processing target material, and a milling time is set to be one hour.

As seen from FIG. 6, the ion beam current is changed by increasing the gas flow rate introduced to the ion gun 1, and in the ion gun configuration which is applied to the experiment, the ion beam current tends to be increased in a range in which the argon gas flow rate is 0 to 0.35 cm³/minute, and the ion beam current tends to be decreased in a range in which the argon gas flow rate is 0.35 to 1.0 cm³/minute. In a range in which the argon gas flow rate is 0 to 0.35 cm³/minute, the ion beam current value is greatly varied, and such a range is a an area where the ion beam current is extremely instable.

In an area where the ion beam current is unstable, since a smaller potential difference is generated between the cathode outlet hole 33 and the acceleration-electrode outlet hole 34, the lens effect is decreased, and thus, the ion beam emitted at an acceleration voltage of 3 kV further spreads. As a result, the ion beam is not able to pass through the acceleration-electrode outlet hole 34 of 2 mmφ, and collides with the peripheral portion of the acceleration-electrode outlet hole 34. This phenomenon causes bad influence such as the redeposition adhering to the acceleration electrode, the deformation of the acceleration-electrode outlet hole, or the contamination due to the redeposition in addition to the destabilization of the ion beam current. It can be seen from the result of FIG. 8 that the influence of the collision of the ion beam with the peripheral portion of the acceleration-electrode outlet hole 34 is excluded by increasing the argon gas flow rate and the stable ion beam current value is acquired.

Figure 9:
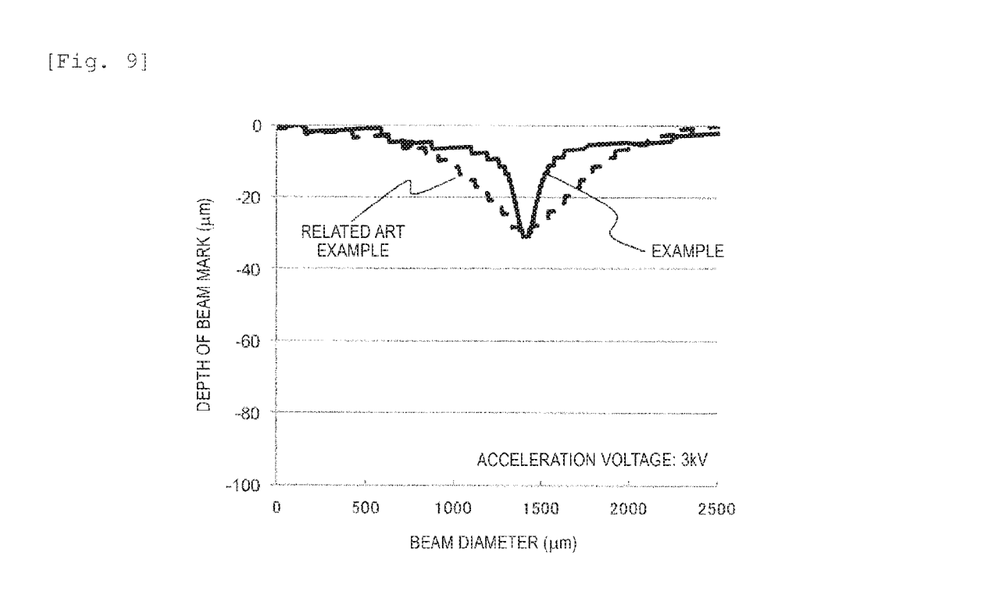
FIG. 9 is an example of an explanatory diagram showing another spot depth of the present invention.

FIG. 9 is an example of an explanatory diagram showing the spot depth of the present invention. Here, this diagram shows a beam profile in a case where the acceleration voltage condition is 3 kV, silicon is used as the processing target material, the milling time is set to be one hour. A related art example is a case where the argon gas flow rate is 0.07 cm³/minute, and an example is a case where the argon gas flow rate is 0.9 cm³/minute. According to the present invention, the half width of the ion beam profile is reduced to about 30% from that of the related art example. Depths of the ion beams, that is, milling rates are approximately equal to each other.

TABLE 2

Example of Another Preferable Range of Operation Parameter of Present Invention

|  | Preferable range | More preferable range | Setting example |
|---|---|---|---|
| Acceleration voltage (kV) | 3 | 3 | 3 |
| Gas flow rate (cm³/minute) | ≥0.3 | ≥0.6 | 0.9 |
| Gas pressure (Pa) | ≥6 × 10⁻² | ≥1.4 × 10⁻¹ | 2 × 10⁻¹ |
| Ion beam current (μA) | ≤65 | ≤45 | 35 |
| Beam spot half width (μm) | ≤330 | ≤300 | 195 |
| Beam spot depth (μm) | ≤40 | ≤30 | 30 |

Table 2 represents a list of a preferable parameter range, a more preferable parameter range, and a setting example in a case where milling is performed on silicon for one hour at an acceleration voltage of 3 kV. As the preferable range, the gas flow rate is 0.3 cm³/minute or more, an internal pressure of the vacuum chamber 4 in this case is 6.0×10⁻² Pa or more, the acquired ion beam current value is 65 μA or less, the half width of the ion beam spot is 330 μm or less, and a beam spot depth is 40 μm or less.

As the more preferable range, the gas flow rate is 0.6 cm³/minute or more, the internal pressure of the vacuum chamber 4 in this case is 1.4×10⁻¹ Pa or more, the acquired ion beam current value is 45 μA or less, the half width of the ion beam spot is 300 μm or less, and the beam spot depth is 30 μm or less. As the setting example, the gas flow rate is 0.9 cm³/minute, the internal pressure of the vacuum chamber 4 in this case is 2.0×10⁻¹ Pa, the acquired ion beam current value is 35 μA, the half width of the ion beam spot is 195 μm, and the beam spot depth is 30 μm.

It is possible to arbitrarily select the ion beam current value, the ion beam shape, and the milling rate by setting the acceleration voltage and the argon gas flow rate as represented in Table 2. In such a configuration, since the ion beam profile can be arbitrarily controlled, it is possible to realize the ion milling device including the ion gun capable of easily performing stable control of the ion current at a low acceleration voltage by selecting the condition so as to be suitable for the material characteristics of the milling target and capable of acquiring the stable ion current by suppressing redeposition adhering to the acceleration electrode, the deformation of the acceleration-electrode outlet hole, or the contamination of the acceleration electrode due to the redeposition.

Figure 10:
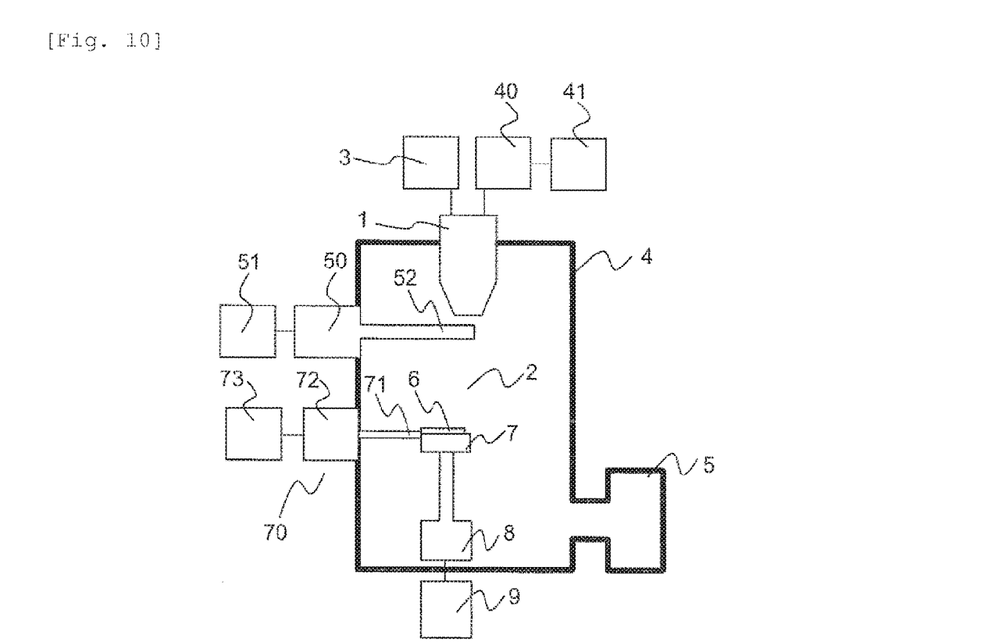
FIG. 10 is another example of the explanatory diagram showing the configuration of the ion milling device of the present invention.

FIG. 10 is another example of the explanatory diagram showing the configuration of the ion milling device of the present invention. An ion milling device is acquired by adding a sample-stage cooling unit 70 for cooling the sample to the device configuration shown in FIG. 1 and the ion milling device includes the sample-stage cooling unit 70 configured such that a cooling source 72 and a cooling control unit 73 are provided on an atmospheric side of the vacuum chamber 4 and the sample 6 and the sample support 7 which are heat sources within the vacuum chamber 4 are connected through a heat transfer unit 71.

In a case where a metal wire acquired by filling an ionic liquid within a resin tube is used as the heat transfer unit 71, a liquid nitrogen dewar is used as the cooling source 72, and these units are connected to the sample 6 and the sample support 7, a cooling range limit of the sample is 700 μmφ in terms of the device configuration. Thus, in the beam profile of the ion gun of the penning discharge type under the related art condition in which the ion beam current is set to have the maximum value as shown in FIG. 3, since a beam spot area is excessively large, the sample 6 is not able to be sufficiently cooled, and thus, it is not possible to avoid thermal damage of the sample.

According to the present invention, it is possible to arbitrarily select a desired ion beam current value, ion beam shape, and milling rate by setting the acceleration voltage and the argon gas flow rate as represented in Tables 1 and 2. Thus, it is possible to select a combination of ion milling having an optimum ion beam current and ion beam profile in consideration of material characteristics of a milling target and cooling performance of the device. Here, although it has been described that the above-described configuration is used as a representative example of the sample-stage cooling unit 70, the present invention may also be applied to a case where the sample-stage cooling unit 70 has another configuration.

As stated above, it is possible to arbitrarily form the ion beam capable of effectively utilizing the cooling performance of the cooling source, and thus, it is possible to perform selection including an increase and a decrease in ion beam current value. As a result, a more excellent cooling effect can be expected. Since the ion milling rate is not greatly decreased, it is possible to achieve a practically sufficient milling rate especially for a milling target of which a milling rate needs to be decreased in order to decrease thermal damage until now. As described above, the present invention can obtain a more excellent effect as a milling device with low heat damage in combination with the ion milling device including the sample-stage cooling unit for cooling the sample.

Figure 11:
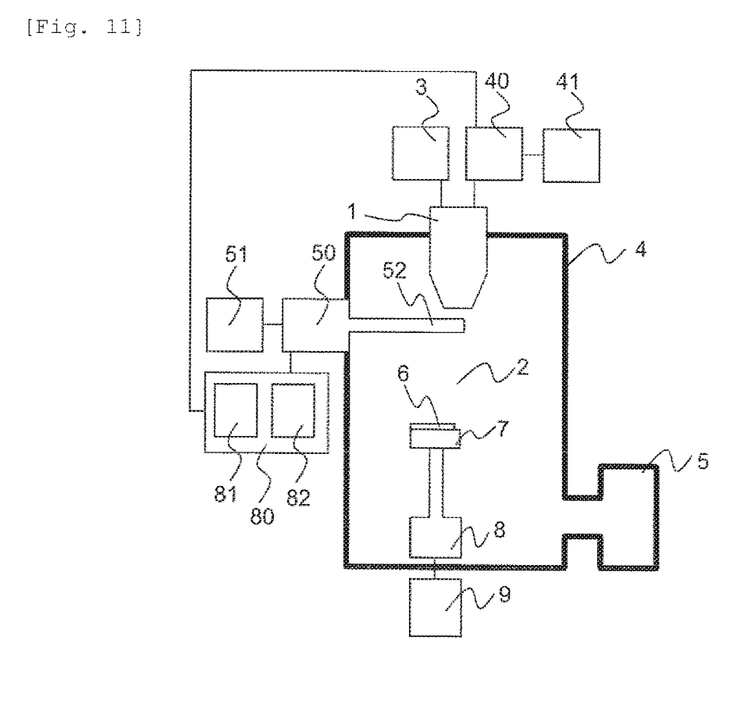
FIG. 11 is still another example of the explanatory diagram showing the configuration of the ion milling device of the present invention.

FIG. 11 is still another example of the explanatory diagram showing the configuration of the ion milling device of the present invention. A central control unit 80 includes at least a gas-flow-rate control unit 81, and an ion-beam-current control unit 82, and is electrically connected to at least the current measurement unit 50 and the gas-flow-rate varying unit 40. The current probe 52 disposed in the current measurement unit 50 includes a mechanism with which the current probe 52 is disposed on an axis of the ion beam 2 by the current-probe driving unit 51 and is retreated from the axis of the ion beam 2. In a case where the current probe 52 is disposed on the axis of the ion beam 2 by the current-probe driving unit 51, an output of the current measurement unit 50 is sent to the central control unit 80, and the central control unit 80 causes the ion-beam-current control unit 82 to monitor the ion beam current value. The central control unit 80 causes the gas-flow-rate control unit 81 to drive the gas-flow-rate varying unit 40, and varies the gas flow rate supplied to the ionization chamber 18 of the ion gun 1. In this case, the central control unit 80 monitors a variation in the ion beam current value measured by the current measurement unit 50, and automatically acquires measurement data represented in FIG. 4 or 8. The central control unit 80 can perform stable ion milling by automatically setting a gas flow rate at which a stable ion beam with no variation can be acquired from the measurement data.

REFERENCE SIGNS LIST

1 Ion gun
2 Ion beam
3 Ion-gun control unit
4 Vacuum chamber
5 Vacuum pumping system
6 Sample
7 Sample support
8 Sample stage
9 Sample-stage driving unit
11 Cathode
12 Cathode
13 Anode
14 Permanent magnet
15 Acceleration electrode
16 Insulator
17 Ion gun base
18 Ionization chamber
21 Discharge power source
22 Acceleration power source
31 Anode inner diameter
32 Anode outlet hole
33 Cathode outlet hole
34 Acceleration-electrode outlet hole
40 Gas-flow-rate varying unit
41 Gas source
50 Current measurement unit
51 Current-probe driving unit
52 Current probe
70 Sample-stage cooling unit
71 Heat transfer unit
72 cooling source
73 Cooling control unit
80 Central control unit
81 Gas-flow-rate control unit
82 Ion-beam-current control unit

The invention claimed is:

1. An ion milling device that controls a half width of a beam profile of an ion beam with which a sample is irradiated from an ion gun to be in a range of 200 μm to 350 μm, the device comprising:
the ion gun that ionizes a gas supplied from the outside, and emits an ion beam;
a gas-flow-rate varying unit that varies a flow rate of the gas supplied to the ion gun; and
a current measurement unit that measures a current value of the ion beam emitted from the ion gun, wherein the gas-flow-rate varying unit is set to control a gas flow rate to be higher than a gas flow rate at which the current value measured by the current measurement unit has a maximum value, and such that a width of the beam profile of the ion beam at a point halfway between a topmost depth of the beam and a bottommost depth of the beam is reduced in relation to a width of the beam at the topmost depth by increasing the gas flow rate to which the gas-flow-rate varying unit is set, and wherein the beam profile is based on a relationship between a beam diameter or width with respect to a spot depth of the beam.

2. The ion milling device according to claim 1, wherein a voltage ranging from 2 kV to 4 kV is applied to an acceleration electrode of the ion gun.

3. The ion milling device according to claim 1, wherein an outlet diameter of an acceleration electrode is 2 mm.

4. The ion milling device according to claim 1, further comprising:
a heat transfer unit that transfers heat from the sample and a sample support to a cooling source.

5. The ion milling device according to claim 1, wherein the gas is selected from the group consisting of an inert gas and a reactant gas.

6. The ion milling device according to claim 1, wherein the gas is argon.

7. The ion milling device according to claim 6, wherein the argon gas is supplied to the ion gun at a flow rate of 0.3 to 0.5 cubic centimeters per minute.

8. The ion milling device according to claim 6, wherein the argon gas is supplied to the ion gun at a flow rate of 0.3 cubic centimeters per minute or more.

9. The ion milling device according to claim 1, wherein the ion gun is a penning discharge type.

10. An ion milling method of controlling a half width of a beam profile of an ion beam to be in a range of 200 μm to 350 μm, and processing a sample, the method comprising:
an emission step of ionizing a gas supplied from the outside, and emitting the ion beam;
an application step of applying a voltage ranging from 2 kV to 4 kV to an acceleration electrode of an ion gun;
a flow-rate varying step of varying a flow rate of the gas supplied to the ion gun;
a measurement step of measuring a current value of the ion beam emitted from the ion gun;
a setting step of setting a gas flow rate to be higher than a gas flow rate at which the ion beam current has a maximum value based on the current value measured in the measurement step; and
an irradiation step of irradiating the sample with the ion beam set in the setting step,
wherein a width of the beam profile of the ion beam at a point halfway between a topmost depth of the ion beam and a bottommost depth of the ion beam is controlled to be smaller than a half width of the beam profile of the ion beam in relation to a width of the beam at the topmost depth and at which the ion beam current has the maximum value set in the setting step, and
wherein the beam profile is based on a relationship between a beam diameter or width with respect to a spot depth of the beam.

* * * * *